US008242027B2

United States Patent
Suzuki

(10) Patent No.: US 8,242,027 B2
(45) Date of Patent: Aug. 14, 2012

(54) SEMICONDUCTOR DEVICE MANUFACTURING METHOD

(75) Inventor: Tatsuya Suzuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 246 days.

(21) Appl. No.: 12/390,751

(22) Filed: Feb. 23, 2009

(65) Prior Publication Data

US 2009/0215278 A1 Aug. 27, 2009

(30) Foreign Application Priority Data

Feb. 25, 2008 (JP) .................................. 2008-42706

(51) Int. Cl.
*H01L 21/469* (2006.01)
*H01L 21/8238* (2006.01)

(52) U.S. Cl. ........ 438/761; 438/199; 438/218; 257/288; 257/E21.632

(58) Field of Classification Search .................. 438/199, 438/218, 761; 257/288, 635, 638, E29.193, 257/E21.633
See application file for complete search history.

(56) References Cited

U.S. PATENT DOCUMENTS

| 6,501,895 | B1 * | 12/2002 | Bloechl et al. | 385/129 |
| 7,041,335 | B2 * | 5/2006 | Chung | 427/255.394 |
| 7,214,629 | B1 * | 5/2007 | Luo et al. | 438/778 |
| 7,795,644 | B2 * | 9/2010 | Wang et al. | 257/206 |
| 2005/0199958 | A1 * | 9/2005 | Chen et al. | 257/368 |
| 2007/0012960 | A1 | 1/2007 | Knoefler et al. | |
| 2007/0018203 | A1 * | 1/2007 | Atanackovic et al. | 257/254 |
| 2007/0105299 | A1 | 5/2007 | Fang et al. | |

FOREIGN PATENT DOCUMENTS

| JP | 2007-27747 | 2/2007 |
| JP | 2007-134718 | 5/2007 |

* cited by examiner

*Primary Examiner* — Leonard Chang
(74) *Attorney, Agent, or Firm* — Young & Thompson

(57) ABSTRACT

Prior to a step of providing a stress layer covering a first transistor, a second transistor and a gate structure, another silicon oxide film is formed over the second transistor to form a silicon oxide film with a predetermined thickness over the second transistor. By a step of removing the portion of the stress layer over the second transistor and the gate structure and leaving the portion of the stress layer over the first transistor, the silicon oxide film over the second transistor is prevented from becoming excessively thinner than the silicon oxide film over the first transistor. The source region and the drain region of the second transistor can be prevented from being shaved because of thinness of the silicon oxide film over the second transistor when removing silicon oxide films over the first transistor and second transistor.

14 Claims, 14 Drawing Sheets

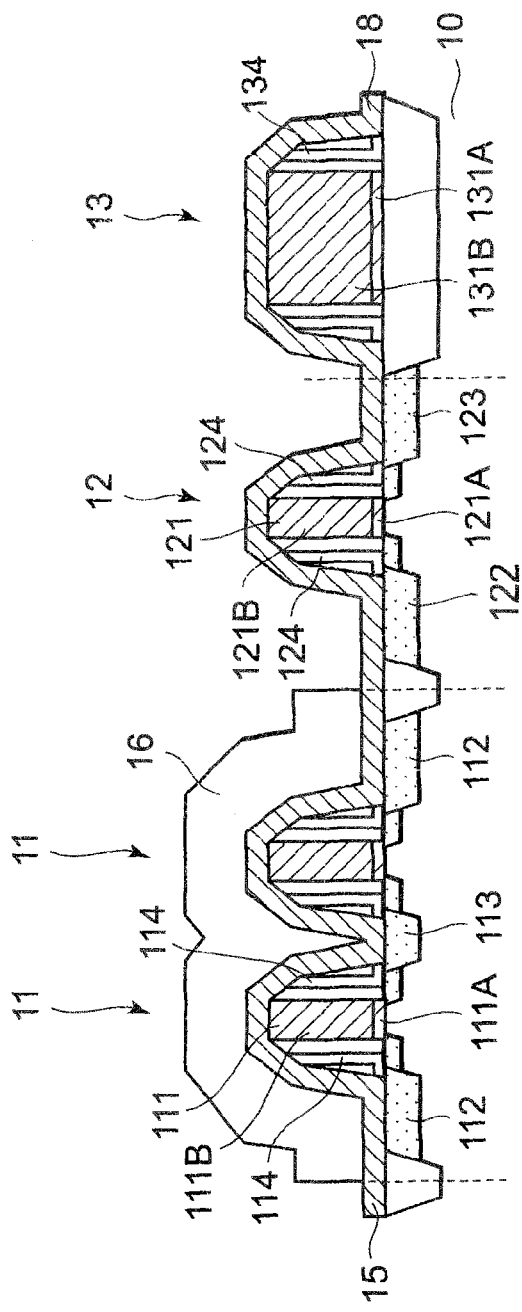
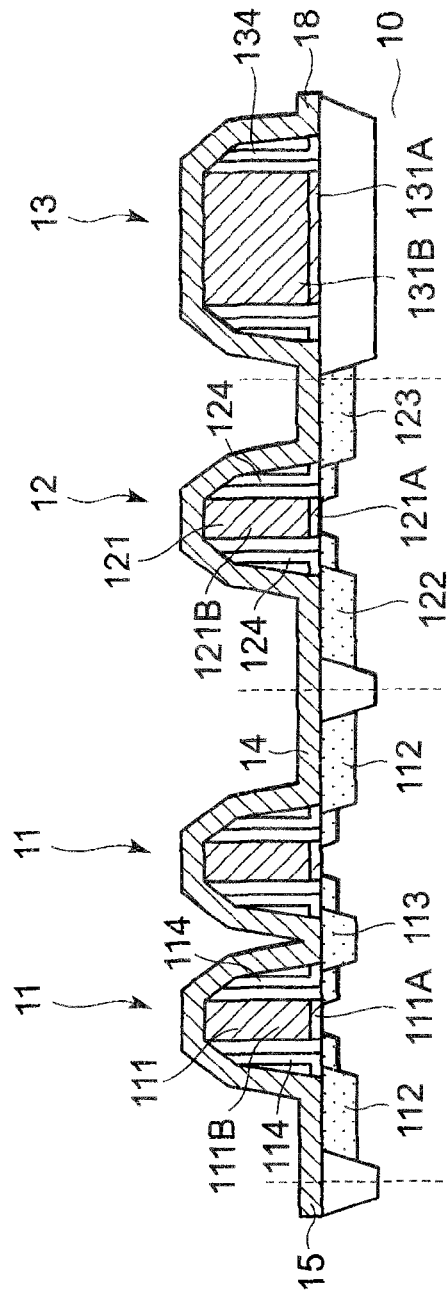
FIG. 4(A)
FIG. 4(B)

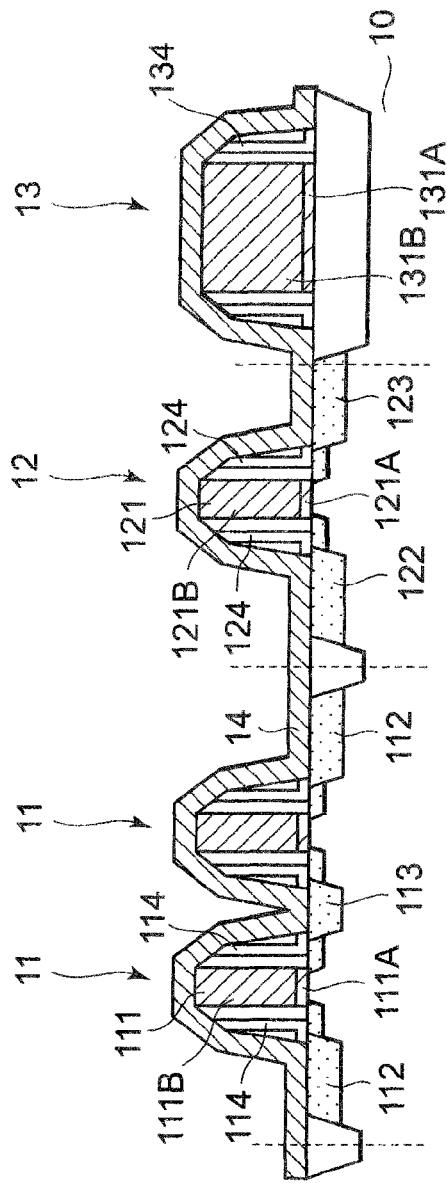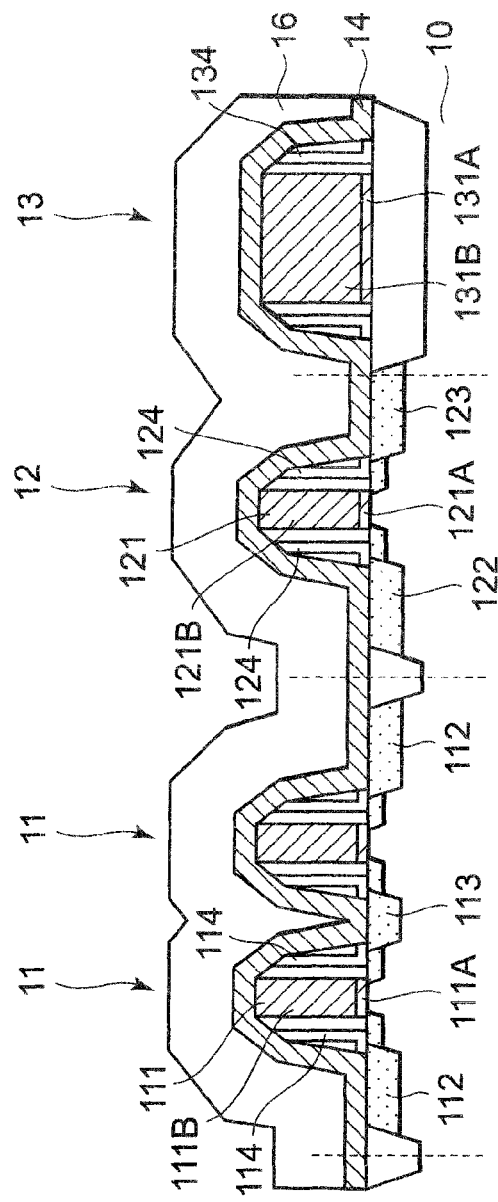
FIG. 6(A)
FIG. 6(B)

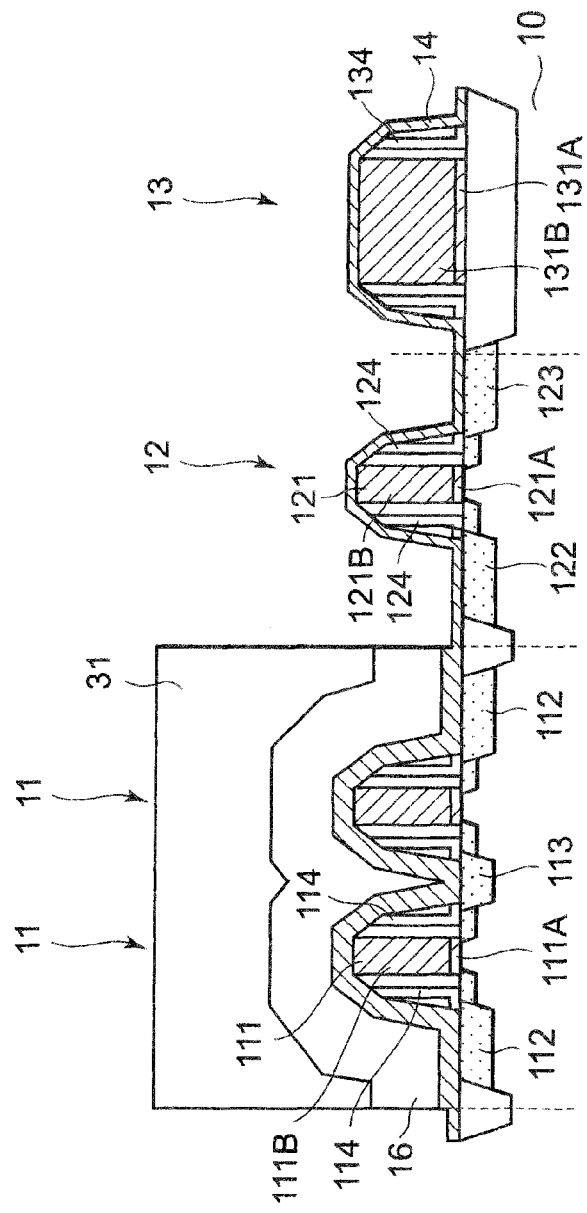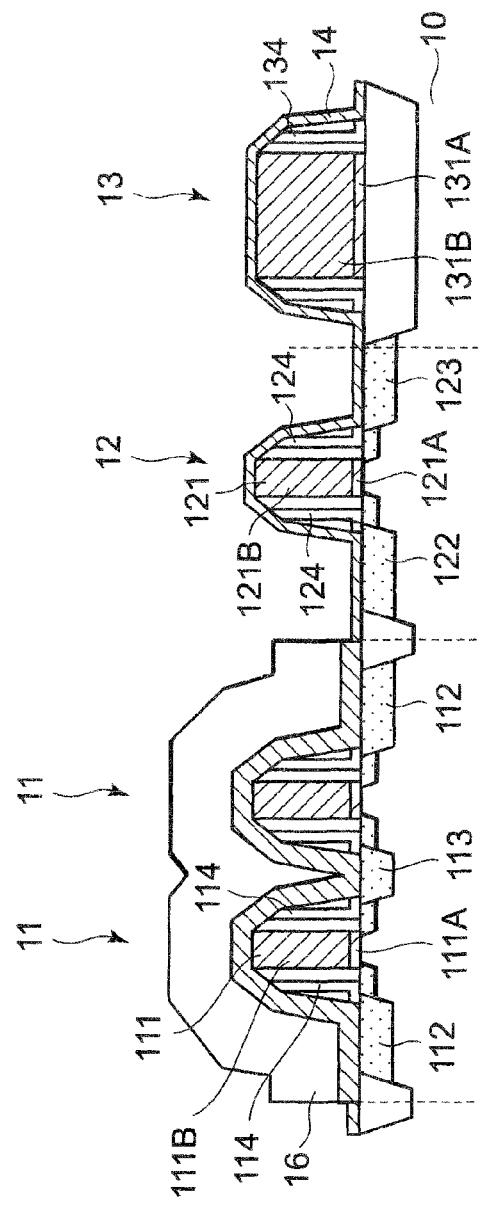
FIG. 7(A)
FIG. 7(B)

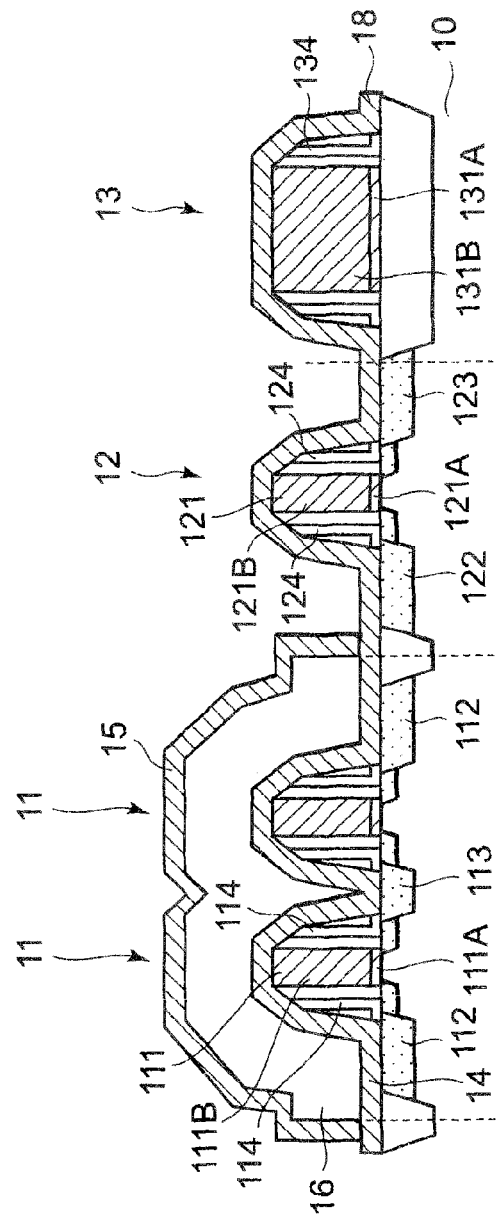
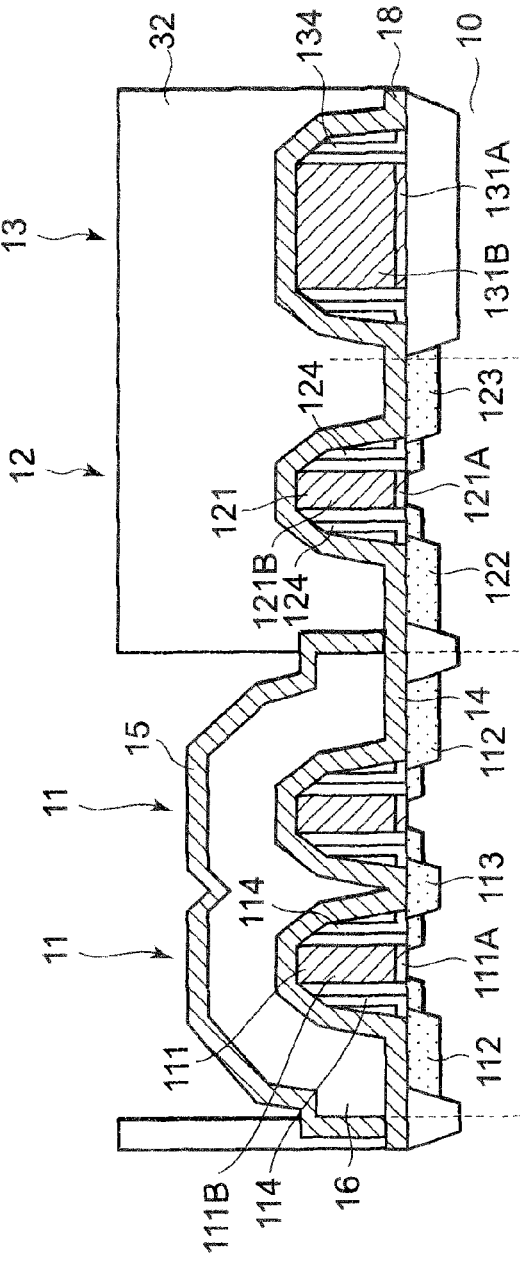
FIG. 8(A)
FIG. 8(B)

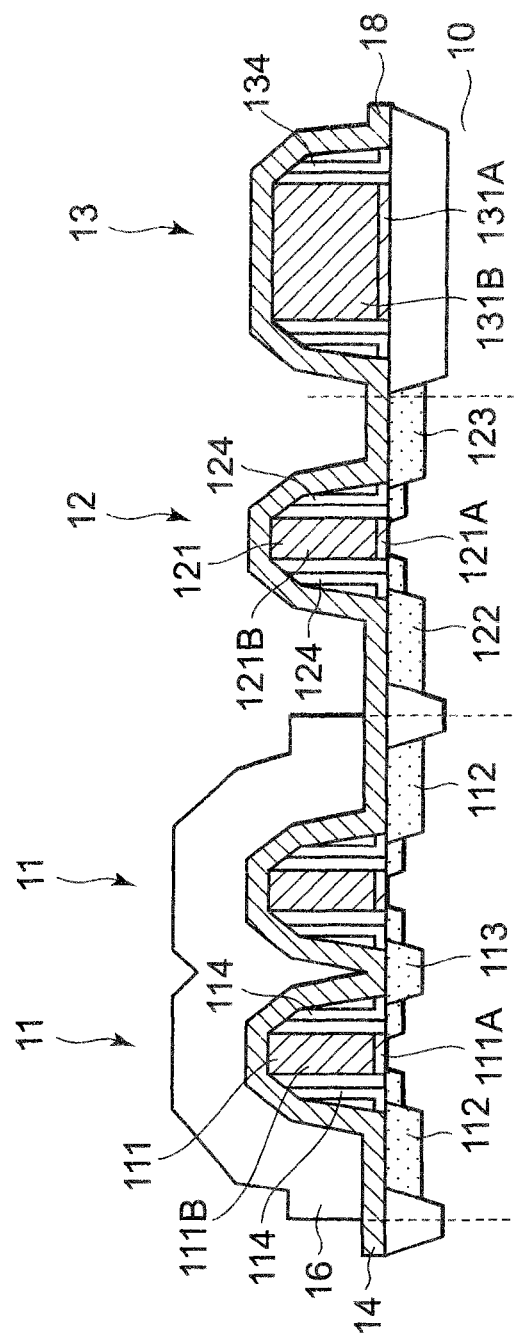
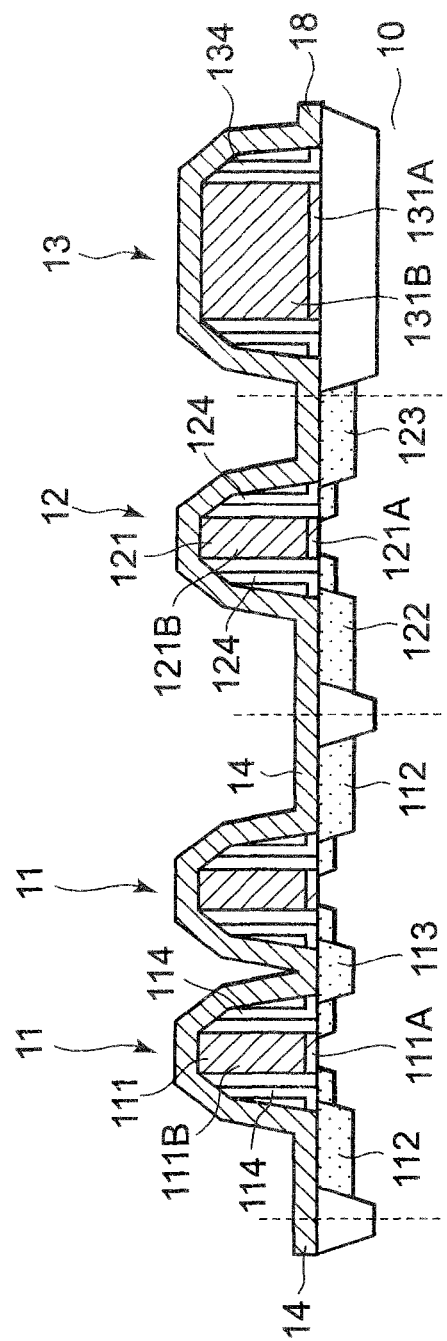
FIG. 9(A)
FIG. 9(B)

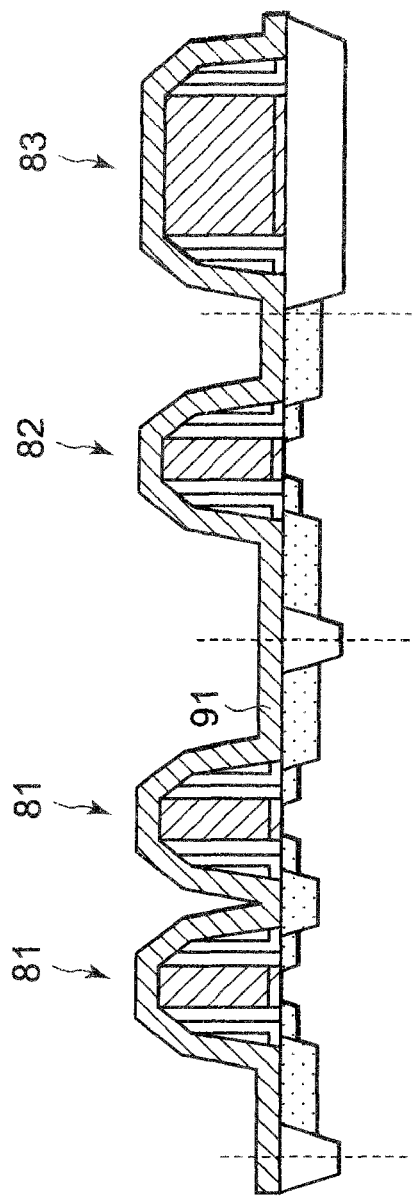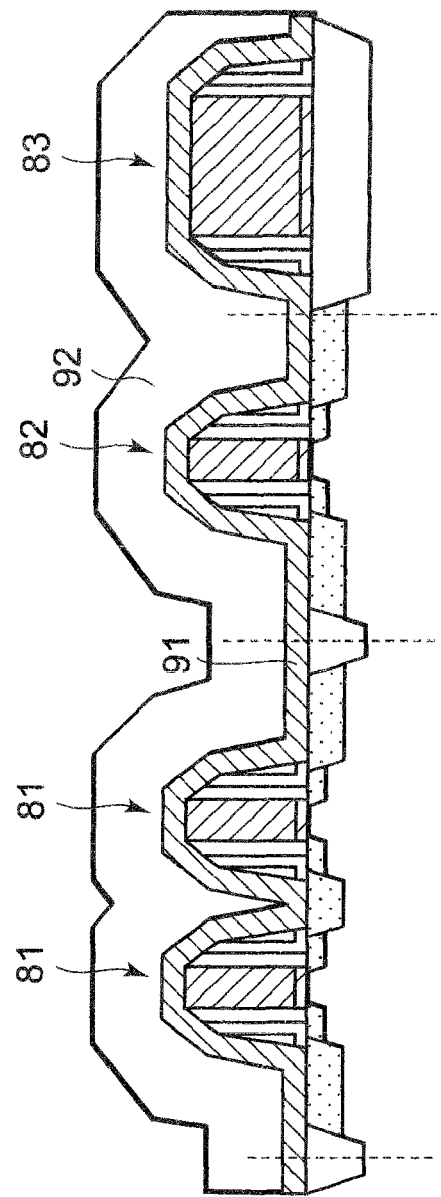
FIG. 11(A)
FIG. 11(B)

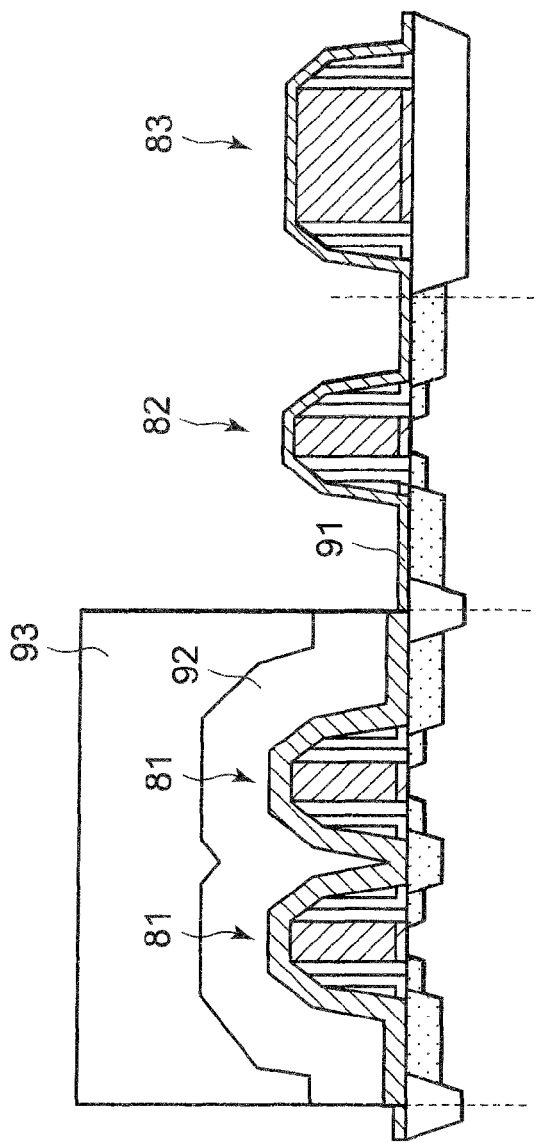
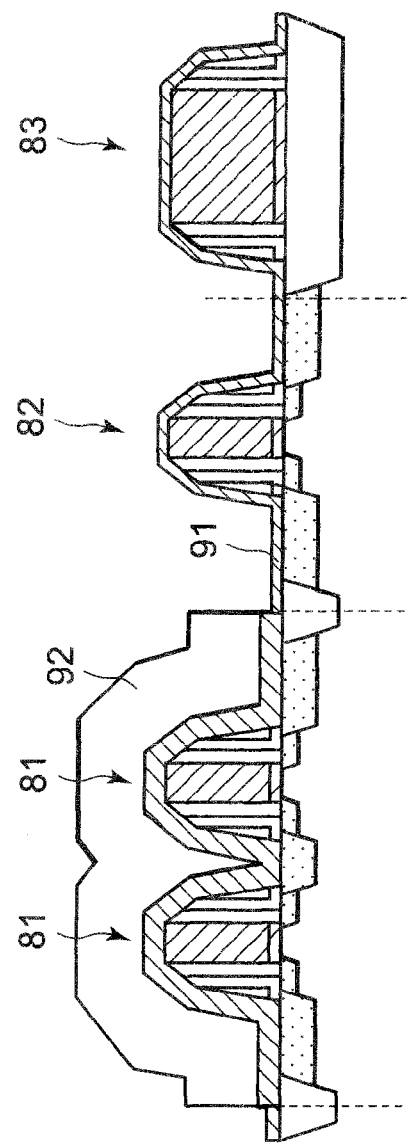
FIG. 12(A)
FIG. 12(B)

SEMICONDUCTOR DEVICE MANUFACTURING METHOD

The present application is based on Japanese Patent Laid-Open No. 2008-042706.

BACKGROUND OF THE INVENTION

The present invention relates to a semiconductor device manufacturing method. Conventionally, as means for enhancing the performance of transistors, a stress memorization technique (SMT) is employed. A stress memorization technique is disclosed in, for example, Japanese Patent Laid-Open Nos. 2007-134718 and 2007-27747.

A stress memorization technique is intended to enhance the performance of transistors by applying stresses to the transistors, and known for, for example, enhancing the electron mobility of a transistor by applying a tensile stress to the transistor and enhancing the hole mobility of a transistor by applying a compressive stress to the transistor.

As a method for applying a stress to a transistor, a stress layer is formed on a transistor, and thermal treatment is performed so that a stress is memorized in the diffusion region or gate polysilicon of the transistor. Consequently, the electron mobility and the hole mobility of the channel region will be enhanced. After the thermal treatment, the stress layer is removed.

Here, the following method can be considered as a more specific manufacturing method in which a stress layer is formed to enhance the performance of transistors.

First, as shown in FIG. 11(A), a silicon oxide film 91 is formed over NMOS transistors 81 in a NMOS forming region, a PMOS transistor 82 in a PMOS forming region, and a gate structure 83.

Next, as shown in FIG. 11(B), a stress layer 92 is formed over the NMOS transistors 81 in the NMOS forming region, the PMOS transistor 82 in the PMOS forming region, and the gate structure 83.

Subsequently, as shown in FIG. 12(A), a photoresist 93 is formed over the NMOS transistors 81, and a portion of the stress layer 92 is removed over the PMOS transistor 82 and the gate structure 83.

In this case, the stress layer 92 is removed by dry etching.

Next, as shown in FIG. 12(B), after removal of the photoresist 93, the substrate is subjected to thermal treatment. Furthermore, as shown in FIG. 13(A), the stress layer 92 is removed by wet etching.

Subsequently, for example, a silicide film is formed in a necessary area by the following procedure. In order to form a silicide film in a region excluding the gate structure 83, as shown in FIG. 13(B), a silicide blocking film 94 is formed. Furthermore, as shown in FIG. 14, a photoresist 95 is formed only over the gate structure 83, and portions of the silicon oxide film 91 and the silicide blocking film 94 are removed over the NMOS transistors 81 and the PMOS transistor 82. No silicide film is formed over the region where the silicide blocking film 94 is left.

Subsequently, although not shown, a silicide film is formed over the diffusion regions of the NMOS transistors 81 and the PMOS transistor 82.

Here, the present inventors have noticed that the above-described semiconductor device manufacturing method has the following problems.

When the stress layer 92 is removed by dry etching, the silicon oxide film 91 underlying the stress layer 92 is removed, too (see FIG. 12(A)). Consequently, the portion of the silicon oxide film 91 over the PMOS transistor 82 becomes thinner compared to the portion of the silicon oxide film 91 over the NMOS transistors 81.

The portion of the silicon oxide film 91 over the PMOS transistor 82 becomes thin due to preliminary cleaning for the step of performing thermal treatment of the substrate (FIG. 12(B)) after the removal of the photoresist 93 and the step of removing the stress layer 92 by wet etching (FIG. 13). Furthermore, as shown in FIG. 14, when the surface of the substrate is exposed by removing a portion of the silicon oxide film 91, the substrate surface (diffusion layer) where the PMOS transistor 82 is formed will be excessively etched. This excessive etching removes impurities doped in the diffusion layer, which may result in an increase in parasitic resistance and/or a decrease in on-state current.

SUMMARY

The present invention provides a semiconductor device manufacturing method comprising: forming a first transistor and a second transistor with a conductive property that is the opposite of that of the first transistor; forming a silicon oxide film covering the first transistor and the second transistor; providing, over the silicon oxide film, a stress layer covering the first transistor and the second transistor to apply a stress to one transistor of the first transistor and the second transistor; removing a portion of the stress layer over the other transistor of the first transistor and the second transistor and leaving a portion of the stress layer over the one transistor; performing thermal treatment of the one transistor and the portion of the stress layer over the one transistor; removing the portion of the stress layer over the one transistor; forming another silicon oxide film over the other transistor to form a silicon oxide film with a predetermined thickness over the other transistor, the step of forming another silicon oxide film being performed prior to the step of providing the stress layer covering the first transistor and the second transistor, or between the step of removing a portion of the stress layer over the other transistor and leaving a portion of the stress layer over the one transistor and the step of removing the portion of the stress layer over the one transistor; and removing a portion of the silicon oxide films over the first transistor and the second transistor.

The present invention is provided with a step of forming another silicon oxide film over the other transistor prior to provision of a stress layer or between the step of removing a portion of the stress layer over the other transistor and the gate structure and leaving a portion of the stress layer over the one transistor and the step of removing the stress layer over the one transistor.

Accordingly, even though the silicon oxide film becomes thin as a result of the surface of the silicon oxide film over the other transistor being removed when removing the stress layer over the other transistor, provision of the step of forming another silicon oxide film ensures provision of the silicon oxide film over the other transistor with a predetermined thickness.

Thus, at the step of removing the silicon oxide film over the first transistor and the second transistor, the diffusion layer of the other transistor can be prevented from being removed together with the silicon oxide film because of thinness of the portion of the silicon oxide film over the other transistor.

Consequently, the transistors can be prevented from lowering in performance.

The stress layer in the present invention is, for example, a silicon nitride film, and is a layer capable of applying various kinds of stress to the transistors covered by the stress layer, by changing the film-forming conditions, thermal treatment conditions, etc.

BRIEF DESCRIPTION OF THE DRAWINGS

The above and other objects, advantages and features of the present invention will be more apparent from the following description taken in conjunction with the accompanying drawings, in which:

FIGS. 4(A) and 4(B) are cross-sectional views illustrating a semiconductor device manufacturing process;

FIGS. 6(A) and 6(B) are cross-sectional views illustrating a semiconductor device manufacturing process according to a second embodiment of the present invention;

FIGS. 7(A) and 7(B) are cross-sectional views illustrating a semiconductor device manufacturing process;

FIGS. 8(A) and 8(B) are cross-sectional views illustrating a semiconductor device manufacturing process;

FIGS. 9(A) and 9(B) are cross-sectional views illustrating a semiconductor device manufacturing process;

FIGS. 11(A) and 11(B) are cross-sectional views illustrating a semiconductor device manufacturing process;

FIGS. 12(A) and 12(B) are cross-sectional views illustrating a semiconductor device manufacturing process;

DETAILED DESCRIPTION OF PREFERRED EMBODIMENTS

Figure 1A:
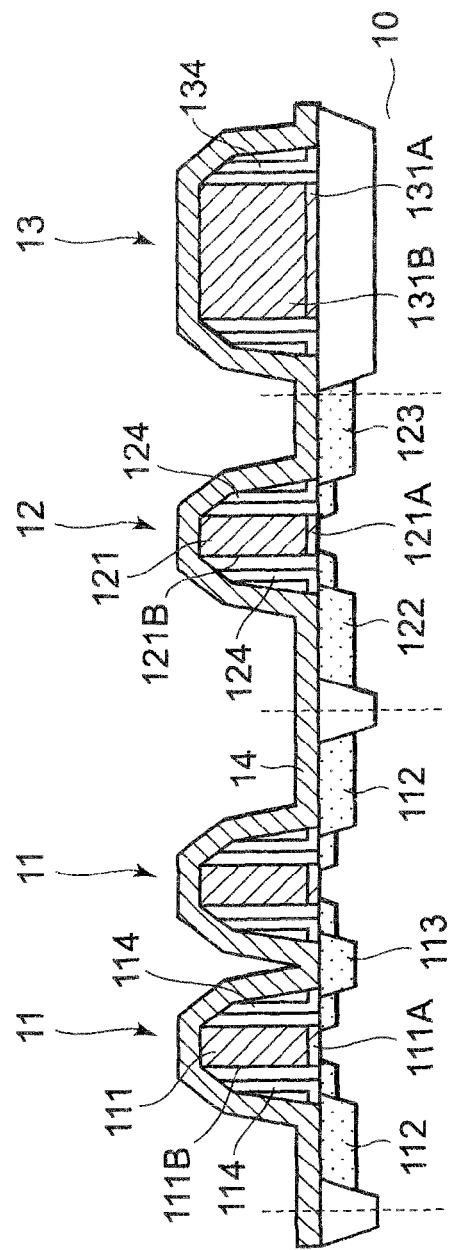
FIGS. 1(A) and 1(B) are cross-sectional views illustrating a semiconductor device manufacturing process according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the drawing. The same components in the drawings are provided with the same reference numeral, and description of the components will not be repeated.

First Embodiment

A first embodiment of the present invention will be described with reference to FIGS. 1 to 5.

First, an overview of a first embodiment will be described.

A semiconductor device manufacturing method according to the present embodiment includes the steps of: forming a first transistor 11, a second transistor 12 with a conductive property that is the opposite of that of the first transistor, and a gate structure 13; forming a silicon oxide film 15 covering the first transistor 11, the second transistor 12 and the gate structure 13; forming, over the silicon oxide film 15, a stress layer 16 covering the first transistor 11, the second transistor 12 and the gate structure 13 to apply a stress to one transistor of the first transistor 11 and the second transistor 12; removing a portion of the stress layer 16 over the other transistor of the first transistor 11 and the second transistor 12, and the gate structure 13, and leaving a portion of the stress layer 16 over the one transistor; performing thermal treatment of the one transistor and the stress layer 16; removing the portion of the stress layer 16 over the one transistor after the step of performing thermal treatment; forming another silicon oxide film 14 over the other transistor to form a silicon oxide film 18 (formed by the another silicon oxide film 14 and the silicon oxide film 15) with a predetermined thickness over the other transistor, prior to the step of providing the stress layer 16 covering the first transistor 11, the second transistor 12 and the gate structure 13; and removing a portion of the silicon oxide films 15 and 18 over the first transistor 11 and the second transistor 12 and leaving a portion of the silicon oxide film 18 over the gate structure 13.

Next, the semiconductor device manufacturing method according to the present embodiment will be described in details.

Here, the semiconductor device is a CMOS device including the first transistors 11, which are of NMOS, and a second transistor 12, which is of PMOS.

First, as shown in FIG. 1(A), the first transistors 11, the second transistor 12 and the gate structure 13 are formed on a substrate 10.

The substrate 10 is a semiconductor substrate, more specifically, a silicon substrate.

Each first transistor 11 is an NMOS transistor provided in the NMOS forming region of the substrate 10, and includes a gate electrode 111, and a source region 112 and a drain region 113, which are arranged with the gate electrode 111 interposed therebetween.

The gate electrode 111 includes a gate oxide film 111A provided on the substrate 10, and a polysilicon film 111B provided over this gate oxide film 111A.

Also, side surfaces of the gate electrode 111 are covered by side walls 114.

Here, a plurality of first transistors 11 is formed in the NMOS forming region.

The second transistor 12 is a PMOS transistor, and provided in the PMOS forming region of the substrate 10. The PMOS forming region and the NMOS forming region are arranged adjacent to each other, but they are separated by an STI region.

As with the first transistors 11, the second transistor 12 includes a gate electrode 121, and a source region 122 and a drain region 123 arranged with the gate electrode 121 interposed therebetween.

The gate electrode 121 includes a gate oxide film 121A provided on the substrate 10 and a polysilicon film 121B provided over this gate oxide film 121A.

Also, side surfaces of the gate electrode 121 are covered by side walls 124.

The gate structure 13 is arranged adjacent to the PMOS forming region, and provided on the STI region. The gate structure 13 includes a gate oxide film 131A provided on the STI, and a polysilicon film 131B provided over the gate oxide film 131A.

Also, side surfaces of the gate structure 13 are covered by side walls 134.

A silicon oxide film ($SiO_2$ film) 14 (another silicon oxide film) is formed so as to integrally cover the first transistors 11, the second transistor 12 and the gate structure 13. This silicon oxide film 14 can be formed by, for example, CVD. This silicon oxide film 14 has a thickness of, for example, 50 Å.

Figure 1B:
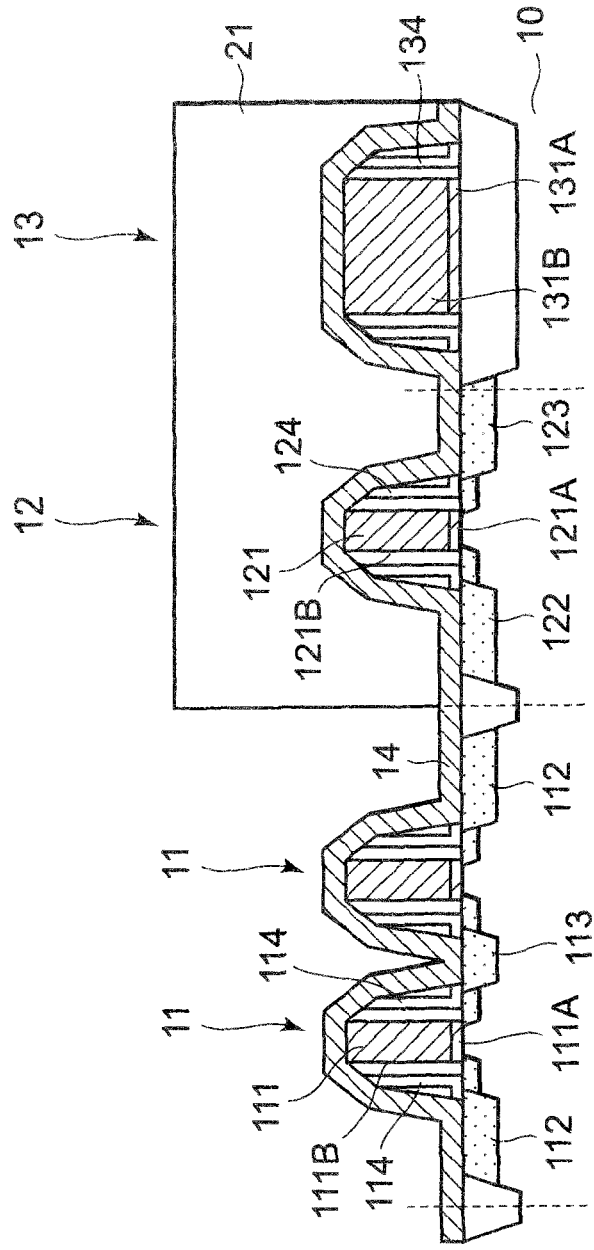

Next, as shown in FIG. 1(B), a photoresist film is formed on the substrate and patterned to form a photoresist 21 over the portion of the silicon oxide film 14 over the second transistor 12 and the gate structure 13. The photoresist 21 is not provided over the first transistors 11.

Subsequently, the silicon oxide film 14 over the first transistors 11 is selectively removed by wet etching. In this case, for example, a hydrofluoric acid is used as an etchant.

Figure 2A:
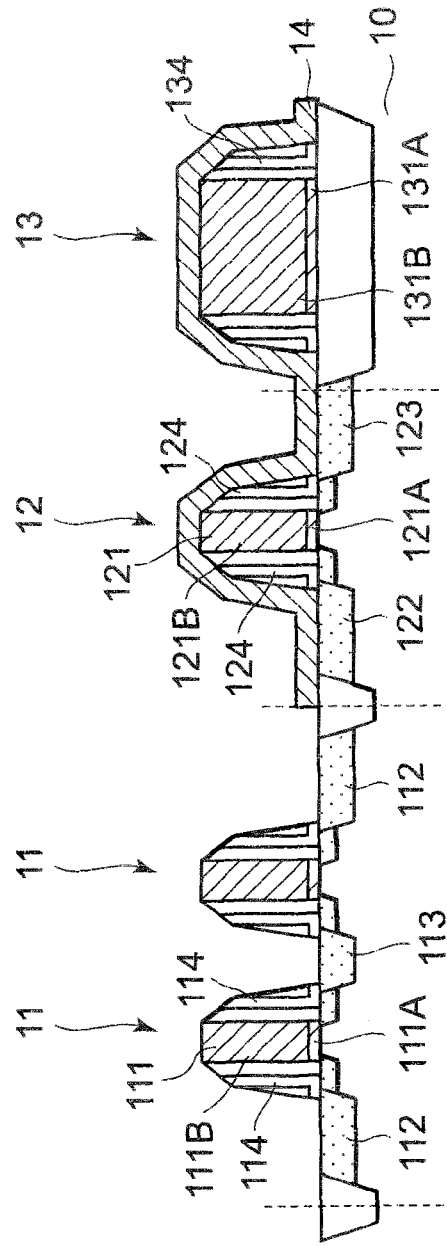
FIGS. 2(A) and 2(B) are cross-sectional views illustrating a semiconductor device manufacturing process.

Subsequently, the photoresist 21 is removed (FIG. 2(A)).

At this stage, the silicon oxide film 14 is not provided over the first transistors 11 while the silicon oxide film 14 is provided over the second transistor 12 and the gate structure 13.

Figure 2B:
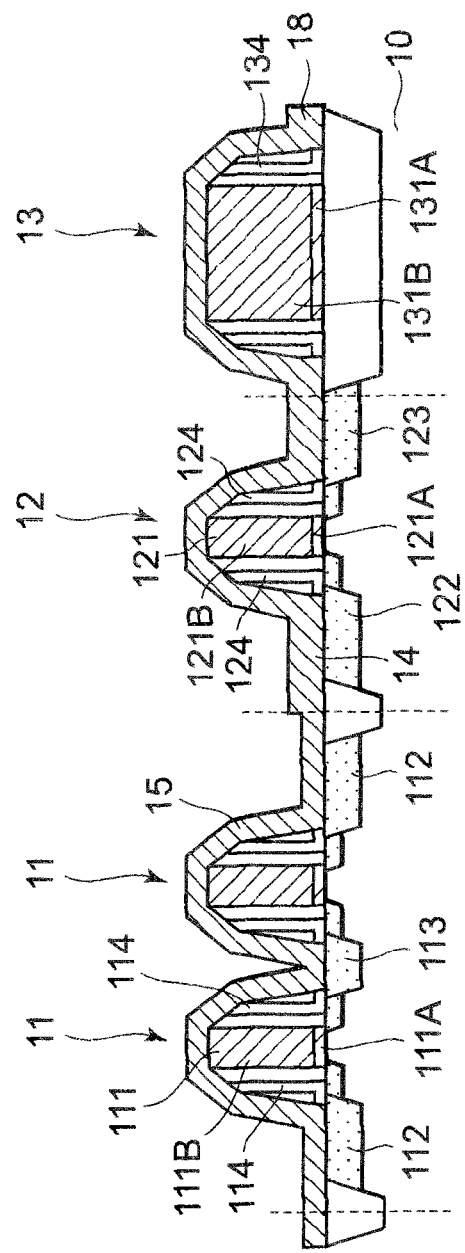

As described in FIG. 2(B), a silicon oxide film ($SiO_2$ film) 15 is formed so as to integrally cover the first transistors 11, the second transistor 12 and the gate structure 13.

This silicon oxide film 15 can be fabricated by a method similar to that of the silicon oxide film 14.

Since the silicon oxide film 14 is provided over the second transistor 12 and the gate structure 13, the silicon oxide film 15 is formed directly on the silicon oxide film 14, and thus, a thick silicon oxide film 18, which is a combination of the silicon oxide film 14 and the silicon oxide film 15, is formed.

Meanwhile, the silicon oxide film 15 is formed directly on the first transistors 11.

Figure 3A:
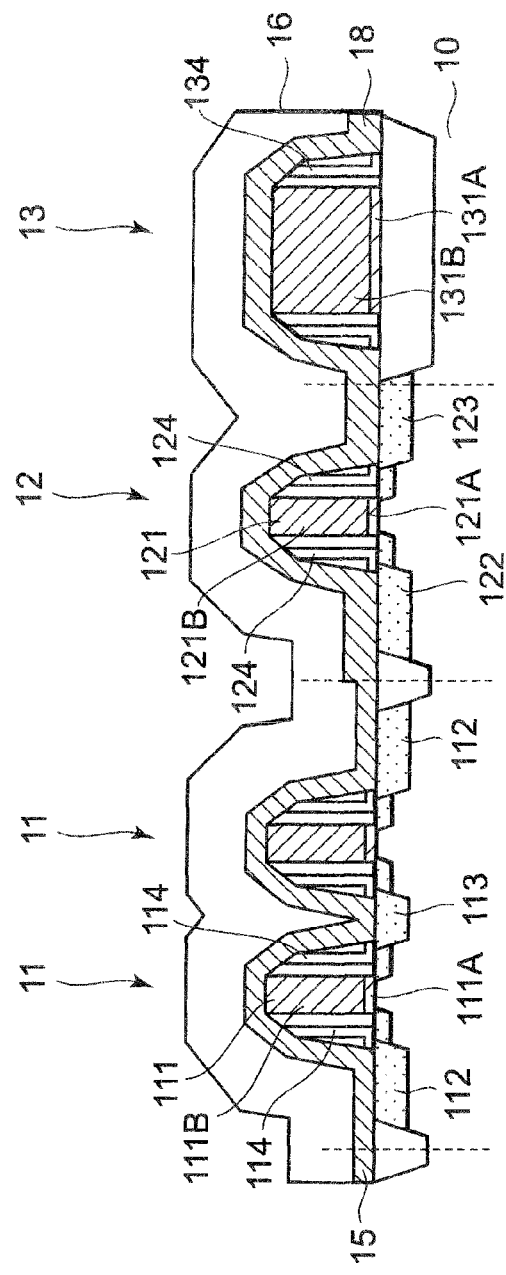
FIGS. 3(A) and 3(B) are cross-sectional views illustrating a semiconductor device manufacturing process.

Next, as described in FIG. 3(A), a stress layer 16 is formed so as to integrally cover the first transistors 11, the second transistor 12 and the gate structure 13.

More specifically, the stress layer 16 is provided directly on the silicon oxide film 15 and thereby covers the silicon oxide film 15.

Here, the stress layer 16 is a silicon nitride film and can be formed by of a plasma process or an ALD (atomic layer deposition) method.

Next, a photoresist film is formed on the upper surface and patterned to form a photoresist 17 over the portion of the stress layer 16 over the first transistors 11. The photoresist 17 is not provided over the portion of the stress layer 16 over the second transistor 12 and the gate structure 13, resulting in the portion of the stress layer 16 over the second transistor 12 and the gate structure 13 being exposed.

Figure 3B:
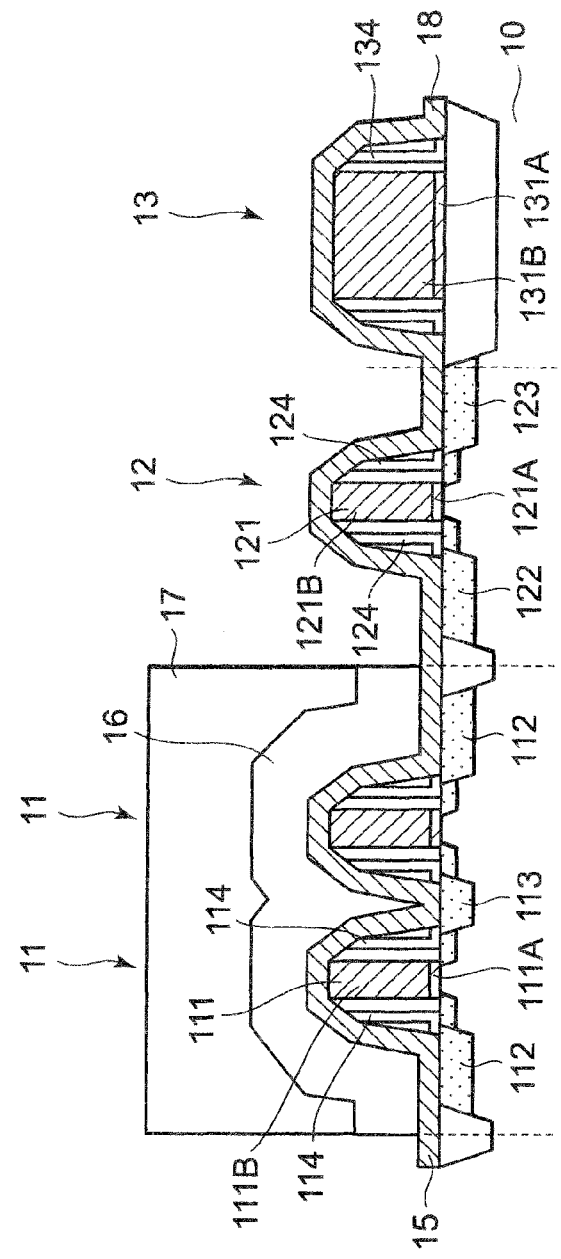

Then, the exposed portion of the stress layer 16 is selectively removed by dry etching (for example, RIE (reactive ion etching)) (FIG. 3(B)).

In this case, the silicon oxide film 18 underlying the portion of the stress layer 16 is etched together with the portion of the stress layer 16, thereby removing the surface of the silicon oxide film 18. The silicon oxide film 18 functions as an etch stop film when the portion of the stress layer 16 is removed.

Then, the silicon oxide film 15 over the first transistors 11 and the remaining silicon oxide film 18 over the second transistor 12 and the gate structure 13 are made to have thicknesses substantially equal to each other.

For example, where the silicon oxide film 14 has a thickness of 50 Å, the stress layer 16 has a thickness of 500 Å, the dry etching selectivity ratio between the stress layer 16 and the silicon oxide film is 5:1, and the silicon oxide film 15 has a thickness of 60 Å, if the amount of over-etching caused by dry etching is set to 50%, the etched amount of the silicon oxide film 18 will be 50 Å, and thus, the thickness of the silicon oxide film 15 over the first transistors 11 and the thickness of the remaining silicon oxide film 18 over the second transistor 12 and the gate structure 13 are both 60 Å.

Where the position where the photoresist 17 is formed is displaced, for example, in FIG. 3(B), where the photoresist 17 is formed in such a manner that it is displaced to the right side of the Figure, a portion of the thick silicon oxide film 18 will remain over the STI region on the PMOS region side. However, even though the portion of the thick silicon oxide film 18 remains, there is no effect because that portion of the silicon oxide film 18 can be removed by the subsequent process.

Also, where the photoresist 17 is displaced to the left side of the Figure, the portion of the silicon oxide film 15 over the STI region on the NMOS region side will be etched by the step of dry-etching of the stress layer 16 in FIG. 3(B). Although the STI region may be etched as a result of further progress of the etching at the subsequent process, no particular problems arise because such etching occurs only slightly on the surface of the STI region and is less likely to affect the properties of the STI region.

However, where the photoresist 17 is largely displaced to the left side of the Figure, the etching may reach the source region 112 of an NMOS transistor, and thus it is preferable that the photoresist 17 is formed with high positional accuracy.

Next, as described in FIG. 4(A), the photoresist 17 is removed and the semiconductor device is subjected to thermal treatment (spike annealing). As a result of this step, stress is applied to the first transistors 11 from the stress layer 16. Before performing thermal treatment (spike annealing) of the semiconductor device, a cleaning step is performed.

Subsequently, as described in FIG. 4(B), the stress layer 16 over the first transistors 11 is removed by wet etching. In this case, for example, a phosphoric acid is used as the etchant.

The silicon oxide films 15 and 18 function as an etch stop film when removing the stress layer 16.

Figure 5A:
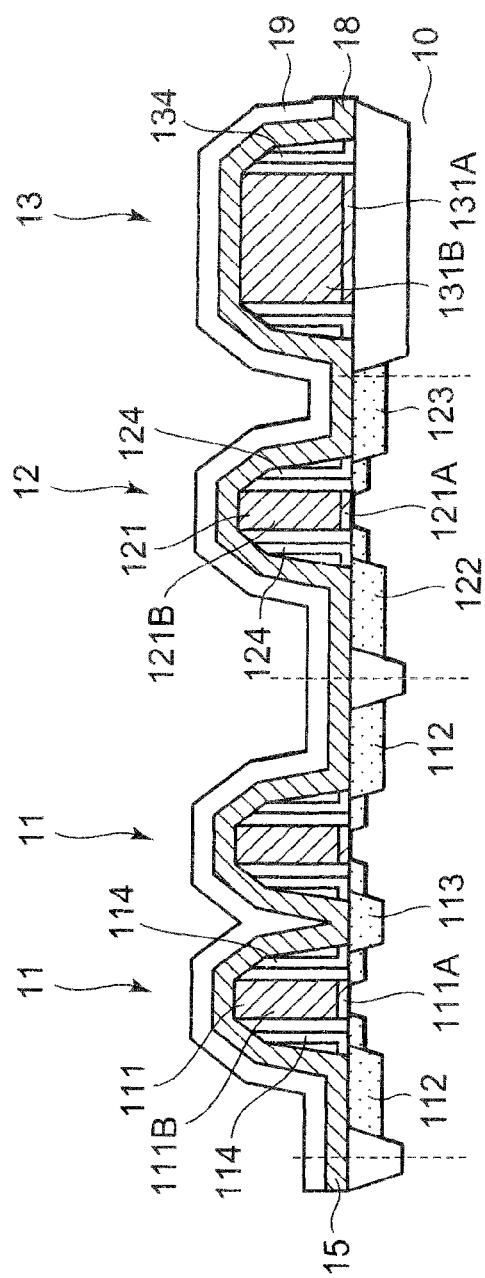
FIGS. 5(A) and 5(B) are cross-sectional views illustrating a semiconductor device manufacturing process.

Next, as described in FIG. 5(A), a suicide blocking film 19 is formed so as to integrally cover the first transistors 11, the second transistor 12 and the gate structure 13. This silicide blocking film 19 is formed directly on the silicon oxide film 15 and the silicon oxide film 18.

The silicide blocking film 19 is, for example, a silicon nitride film.

Figure 5B:
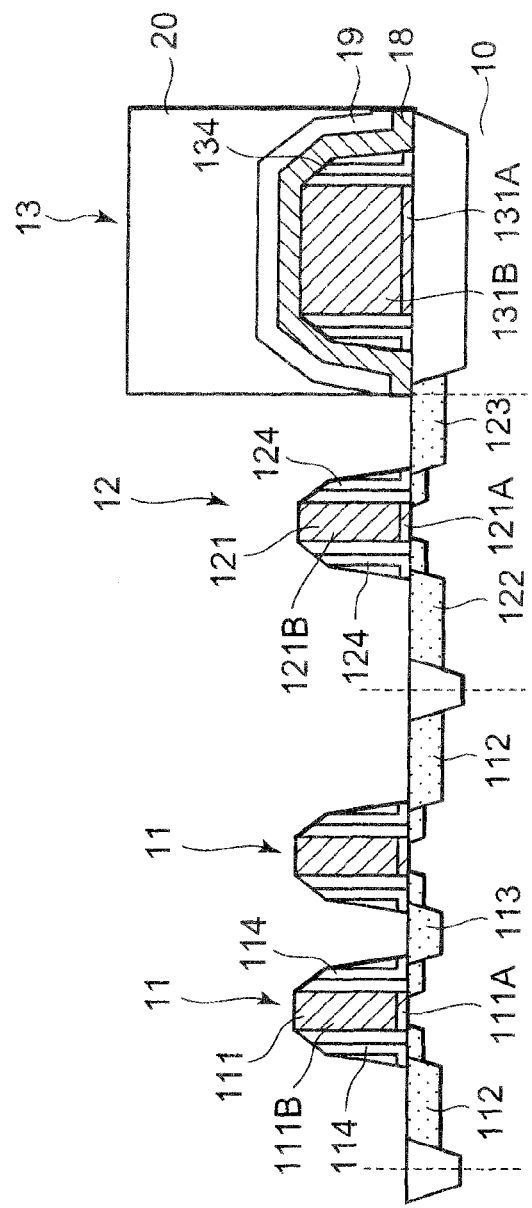

Subsequently, as described in FIG. 5(B), a photoresist film is formed over the upper surface and patterned to form a photoresist 20 over the gate structure 13. The portion of the silicide blocking film 19 over the first transistors 11 and the silicide blocking film 19 over the second transistor 12 are exposed.

In this state, the silicide blocking film 19, the silicon oxide film 15 and the silicon oxide film 18 are selectively removed by dry etching (for example, RIE).

The silicide blocking film 19 and the silicon oxide film 15 over the first transistors 11 and the silicide blocking film 19 and the silicon oxide film 18 over the second transistor 12 are removed simultaneously at the same etching step, and the suicide blocking film 19 and the silicon oxide film 18 remain only over the gate structure 13. Thus, the silicide blocking film 19 and the silicon oxide film 18 are formed only over a particular region in which no silicide layer is formed.

Subsequently, the photoresist 20 is removed and a silicide layer is formed.

Through the above-described steps, a semiconductor device is manufactured.

Next, operational advantages of the present embodiment will be described.

Prior to provision of the stress layer 16, the portion of the silicon oxide film 14 over the first the transistors 11 is removed with the portion of the silicon oxide film 14 over the gate structure 13 and the second transistor 12 left.

Subsequently, the silicon oxide film 15 is formed so as to integrally cover the first transistors 11, the second transistor 12 and the gate structure 13.

Consequently, the silicon oxide film 18 (layer formed by combining the silicon oxide film 14 and the silicon oxide film 15) over the second transistor 12 and the gate structure 13 has a thickness larger than that of the silicon oxide film 15 over the first transistors 11.

Subsequently, the stress layer 16 is provided over the first transistors 11, the second transistor 12 and the gate structure 13, and the portion of the stress layer 16 over the second transistor 12 and the gate structure 13 is removed. At this time, even though the silicon oxide film 18 over the second transistor 12 and the gate structure 13 is etched, the silicon oxide film 18 over the second transistor 12 and the gate structure 13 can be ensured to have a predetermined thickness.

Consequently, the source region 122 and the drain region 123 of the second transistor 12 can be prevented from being etched because of thinness of the silicon oxide film over the second transistor 12 when the silicide blocking film 19 and the silicon oxide films 15 and 18 over the first transistors 11 and the second transistor 12 are removed.

In particular, in the present embodiment, when removing the stress layer 16 over the second transistor 12 and the gate structure 13, the remaining silicon oxide film 18 over the second transistor 12 and the gate structure 13 and the silicon oxide film 15 over the first transistors 11 are made to have the same thickness.

Consequently, when removing the silicide blocking film 19 and the silicon oxide films 15 and 18 over the first transistors 11 and the second transistor 12, the silicon oxide film 15 over the first transistors 11 and the portion of the silicon oxide film 18 over the second transistor 12 have thicknesses substantially equal to each other, and thus, both of the silicon oxide films 15 and 18 can reliably be removed, and the source region 122 and the drain region 123 of the second transistor 12 can be prevented from being shaved due to etching.

Consequently, the semiconductor device can be prevented from lowering in performance.

In the removal of the photoresist 17, the cleaning process before thermal treatment of the stress layer 16, and the removal of the portion of the stress layer 16 over the first transistors 11, the silicon oxide film 18 may be removed slightly. However, since the amount of removal is very small, there is almost no effect when the silicide blocking film 19, the silicon oxide film 15 and the silicon oxide film 18 are removed by dry etching.

Also, in the present embodiment, subsequent to the step of removing the portion of the stress layer 16 over the second transistor 12 and the gate structure 13 by dry etching, the remaining stress layer 16 over the first transistors 11 is removed by wet etching. When the silicon oxide film over the second transistor 12 and the gate structure 13 becomes extremely thin as a result of the etching performed to remove the portion of the stress layer 16 over the second transistor 12 and the gate structure 13, the source and drain regions 122 and 123 of the second transistor 12 may be etched when removing the remaining stress layer 16 over the first transistors 11 by wet etching.

Meanwhile, in the present embodiment, as described above, even though the silicon oxide film 18 over the second transistor 12 and the gate structure 13 is etched when removing the portion of the stress layer 16 over the second transistor 12 and the gate structure 13, a predetermined thickness can be ensured for the silicon oxide film 18 over the second transistor 12 and the gate structure 13.

In other words, in the present embodiment, when removing the remaining stress layer 16 over the first transistors 11 by wet etching, the silicon oxide film 18 with a predetermined thickness remains over the second transistor 12, ensuring that the second transistor 12 is prevented from lowering in performance.

Furthermore, in the present embodiment, as the stress layer 16, a silicon nitride film is used. Consequently, the present embodiment provides advantages in that: sufficient stress can be applied to the transistors; electron and hole carrier mobilities can be increased; and the performance of the transistors can be enhanced.

Second Embodiment

A second embodiment of the present invention will be described with reference to FIGS. 6 to 10.

Although in the foregoing embodiment, an additional silicon oxide film has been deposited over the second transistor 12 and the gate structure 13 prior to forming the stress layer 16, in the present embodiment, an additional silicon oxide film is deposited over the second transistor 12 and the gate structure 13 after forming the stress layer 16.

The thicknesses of the respective layers and firms, and the processing conditions in the second embodiment are similar to those in the first embodiment.

First, as described in FIG. 6(A), first transistors 11, a second transistor 12 and a gate structure 13 are formed, and a silicon oxide film 14 is further formed over the first transistors 11, the second transistor 12 and the gate structure 13.

Next, as described in FIG. 6(B), a stress layer 16 is formed over the first transistors 11, the second transistor 12 and the gate structure 13. This stress layer 16 is provided directly on the silicon oxide film 14 and thereby covers the silicon oxide film 14.

Furthermore, a photoresist film is formed over the upper surface and patterned to form a photoresist 31 over the stress layer 16 over the first transistors 11, and the portion of the stress layer 16 over the second transistor 12 and the gate structure 13 is selectively removed (FIG. 7(A)). In this case, the stress layer 16 is removed by dry etching.

At this time, as described in FIG. 7(B), the portion of the silicon oxide film 14 over the second transistor 12 and the gate structure 13 is etched, resulting in that the thickness of the portion of the silicon oxide film 14 over the second transistor 12 and the gate structure 13 is smaller than the thickness of the portion of the silicon oxide film 14 over the first transistors 11. The silicon oxide film 14 functions as an etch stop film when removing the stress layer 16.

Subsequently, the photoresist 31 is removed, and the substrate with a semiconductor device formed thereon is subjected to thermal treatment (spike annealing). Consequently, stress is applied to the first transistors 11.

Next, as described in FIG. 8(A), a silicon oxide film 15 (another silicon oxide film) is formed over the first transistors 11, the second transistor 12 and the gate structure 13.

This silicon oxide film 15 is in contact with the portion of the stress layer 16 over the first transistors 11, and also in contact with the portion of silicon oxide film 14 over the second transistor 12 and the gate structure 13.

Consequently, a silicon oxide film 18, which is a, laminate of the silicon oxide film 14 and the silicon oxide film 15, is formed over the second transistor 12 and the gate structure 13.

Here, the silicon oxide film 15 has a thickness enabling the silicon oxide film 18 and the portion of the silicon oxide film 14 over the first transistors 11 to have thicknesses substantially equal to each other.

Subsequently, a photoresist film is formed over the upper surface and patterned to form a photoresist 32 over the second transistor 12 and the gate structure 13, and the portion of the silicon oxide film 15 over the first transistors 11 is exposed (FIG. 8(B)).

Then, the portion of the silicon oxide film 15 over the first transistors 11 is removed by wet etching.

Here, where the position where the photoresist 32 is formed is displaced, resulting in that the photoresist 32 is provided in such a manner that it covers an end of the stress layer 16 (FIG. 8(B): where the photoresist 32 is formed with a displacement to the left side), the silicon oxide film 15 remains in the portion of the photoresist 32 adjacent to the end of the stress layer 16. However, even though the silicon oxide film 15 remains in the portion adjacent to the end of the stress layer 16, there is no effect on the stress applied to the transistors 11. Also, even though the silicon oxide film 15 remains in the portion adjacent to the end of the stress layer 16, there is no effect because the remaining silicon oxide film 15 is removed at the subsequent process (in particular, it is removed in the step of removing a silicide blocking film 19).

Also, even though the photoresist 32 is formed with a displacement to the right side in FIG. 8(B), as in the case of the first embodiment, no particular problem occur because such displacement causes the STI surface to be etched only slightly, and is less likely to cause etching that may affect the properties of the SIT.

However, as in the first embodiment, it is desirable that the photoresist 32 be formed with high positional accuracy.

Next, the photoresist 32 is removed and the silicon oxide film 18 is exposed (FIG. 9(A)).

Furthermore, the stress layer 16 is removed by wet etching (FIG. 9(B)). The silicon oxide film 14 functions as an etch stop film when removing the stress layer 16.

Figure 10A:
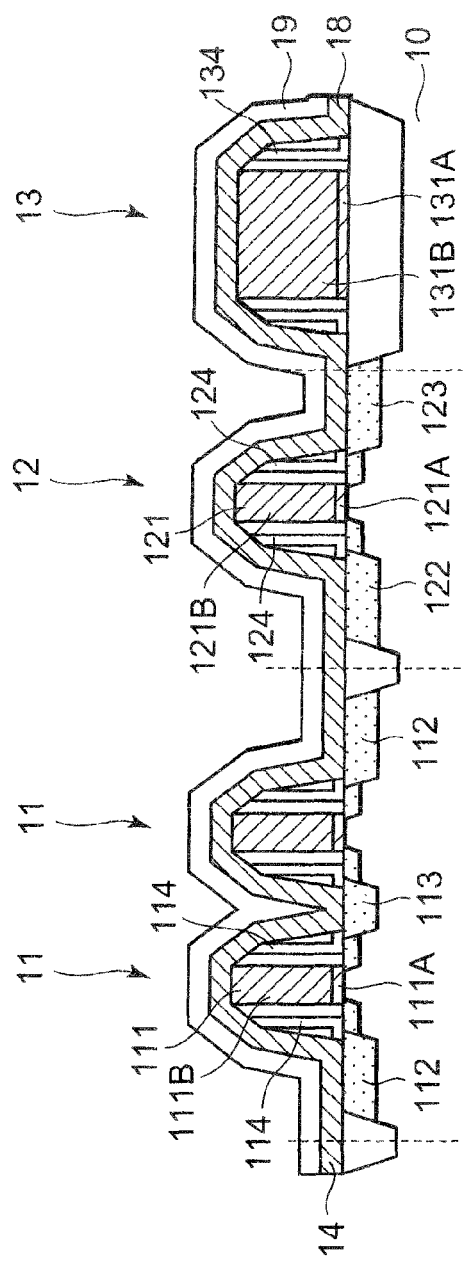
FIGS. 10(A) and 10(B) are cross-sectional views illustrating a semiconductor device manufacturing process.
Figure 10B:
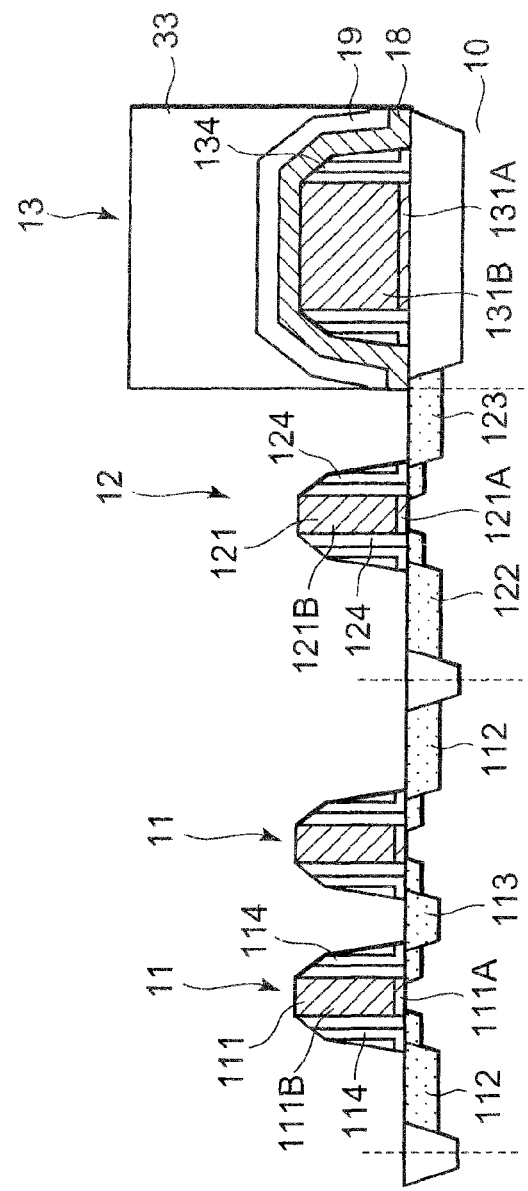
Figure 13A:
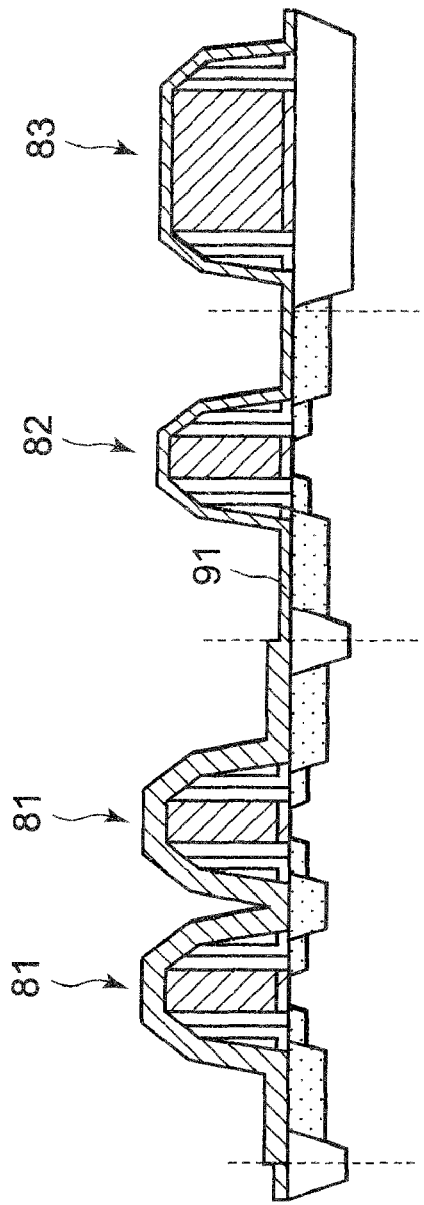
FIGS. 13(A) and 13(B) are cross-sectional views illustrating a semiconductor device manufacturing process.
Figure 13B:
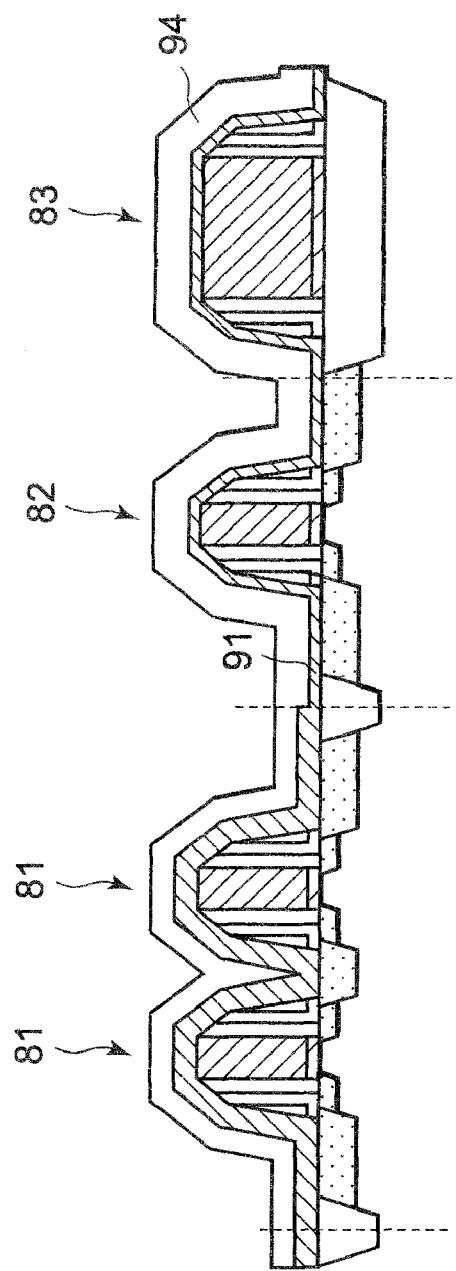
Figure 14:
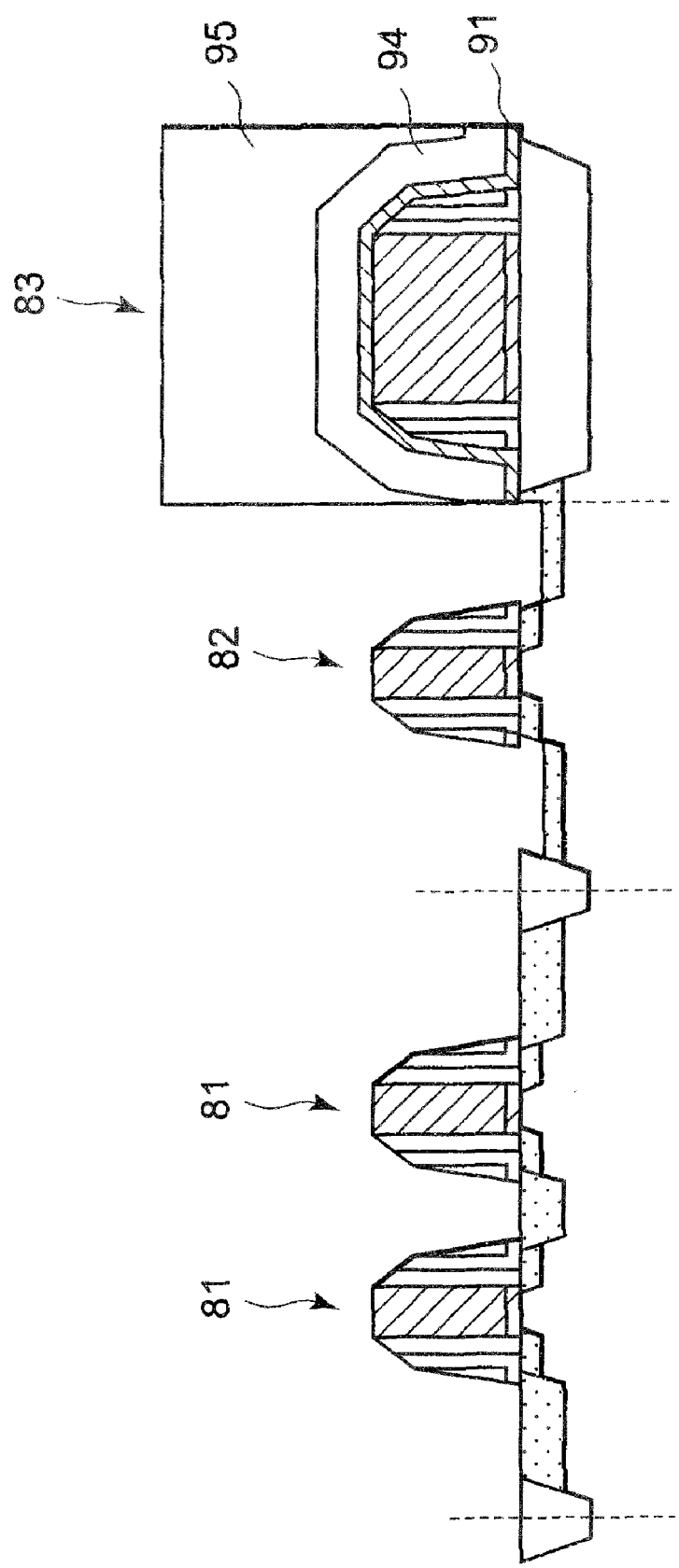
FIG. 14 is a cross-sectional view illustrating a semiconductor device manufacturing process.

Subsequently, as described in FIG. 10(A), a silicide blocking film 19 is provided over the first transistors 11, the second transistor 12 and the gate structure 13. This silicide blocking film 19 is formed directly on the portion of the silicon oxide film 14 over the first transistors 11 and on the silicon oxide film 18 over the second transistor 12 and the gate structure 13.

Next, a photoresist film is formed over the upper surface and patterned to form a photoresist 33 over the gate structure 13, and the portion of the silicide blocking film 19 and the silicon oxide film 14 over the first transistors 11 and the portion of the silicide blocking film 19 and the silicon oxide film 18 over the second transistor 12 are removed by dry etching.

Subsequently, the photoresist 33 is removed and a silicide layer is formed.

Through the above-described steps, a semiconductor device is manufactured.

The second embodiment as described above can provide advantages similar to those of the first embodiment.

More specifically, the stress layer 16 is provided, and the portion of the stress layer 16 over the second transistor 12 and the gate structure 13 is selectively removed. In this step of removing the stress layer 16, the portion of the silicon oxide film 14 over the second transistor 12 and the gate structure 13 is etched and thus become thinner than the portion of the silicon oxide film 14 over the first transistors 11.

However, after the selective removal of the stress layer 16, a silicon oxide film 15 is formed over the first transistors 11, the second transistor 12 and the gate structure 13.

Consequently, the thickness of the portion of the silicon oxide film 14 over the first transistors 11 and the thickness of the silicon oxide film 18, which is formed by combining the portions of the silicon oxide film 14 and the silicon oxide film 15 over the second transistor 12 and the gate structure 13 can be made to correspond to each other.

Thus, the source region and the drain region of the second transistor 12 can be prevented from being etched when removing the portions of the silicide blocking film 19 and the silicon oxide film 14 over the first transistors 11 and the portion of the silicide blocking film 19 and the silicon oxide film 18 over the second transistor 12 by dry etching.

Consequently, the semiconductor device can be prevented from lowering in performance.

Also, subsequent to the step of removing the portion of the stress layer 16 over the second transistor 12 and the gate structure 13, the remaining stress layer 16 over the first transistors 11 is removed by wet etching, and if the silicon oxide film over the film second transistor 12 and the gate structure 13 becomes extremely thin as a result of etching for removing the portion of the stress layer 16 over the film second transistor 12 and the gate structure 13, the source and drain regions of the second transistor 12 may be etched when removing the remaining stress layer 16 over the first transistors 11 by wet etching.

Meanwhile, in the present embodiment, prior to the removal of the remaining stress layer 16 over the first transistors 11 by wet etching, the silicon oxide film 15 is formed, ensuring a predetermined thickness for the silicon oxide film 18 over the second transistor 12 and the gate structure 13.

Thus, the second transistor 12 can be prevented from lowering in performance when removing the remaining stress layer 16 over the first transistors 11 by wet etching.

Also, in the present embodiment, subsequent to the step of removing the portion of the stress layer 16 over the second transistor 12 and the gate structure 13, the silicon oxide film 15 is formed, ensuring a predetermined thickness for the silicon oxide film 18 over the second transistor 12 and the gate structure 13.

Consequently, the thickness of the silicon oxide film 15 can be determined after the etched amount of the silicon oxide film 14 when removing the portion of the stress layer 16 over the second transistor 12 and the gate structure 13 is checked. Thus, the source region and the drain region of the second transistor 12 can more reliably be prevented from being etched when removing the portions of the silicide blocking film 19 and the silicon oxide film 14 over the first transistors 11 and the portion of the silicide blocking film 19 and the silicon oxide film 18 over the second transistor 12 by dry etching.

The present invention is not limited to the above-described embodiments and modifications and variations, etc., of the present invention are possible within the scope that can achieve the object of the present invention.

For example, in the second embodiment, when selectively removing the portion of the stress layer 16 over the second transistor 12 and the gate structure 13, the portion of the silicon oxide film 14 over the second transistor 12 and the gate structure 13 remains, but the portion of the silicon oxide film 14 may completely be removed if over-etching does not occur in the second transistor 12 and the gate structure 13.

In this case, it is only necessary to make the thickness of the silicon oxide film 15 be the same as the thickness of the portion of the silicon oxide film 14 over the first transistors 11.

Furthermore, in the above-described embodiments, the gate structure 13 is provided on the substrate 10, but the gate structure 13 can be omitted. Where no gate structure 13 is provided, the step of providing the silicide blocking film 94 may also be omitted.

What is claimed is:

1. A semiconductor device manufacturing method, comprising:
   forming a PMOS transistor and an NMOS transistor;
   forming a silicon oxide film having a first thickness covering one of the PMOS transistor and the NMOS transistor and having a second thickness different from the first thickness covering the other of the PMOS transistor and the NMOS transistor;
   providing, over the first and second thickness of the silicon oxide films, a stress layer covering both the PMOS transistor and the NMOS transistor to apply a stress to one transistor of the PMOS transistor and the NMOS transistor;
   removing a portion of the stress layer over the other transistor of the PMOS transistor and the NMOS transistor, and leaving a portion of the stress layer over the one transistor of the PMOS transistor and the NMOS transistor, such that the first and second thickness of the silicon oxide film are made to be substantially equal;
   performing thermal treatment of the one transistor of the PMOS transistor and the NMOS transistor and the portion of the stress layer over the one transistor of the PMOS transistor and the NMOS transistor;
   removing the portion of the stress layer over the one transistor of the PMOS transistor and the NMOS transistor; and
   removing a portion of the silicon oxide film over the PMOS transistor and the NMOS transistor,
   wherein both the silicon oxide film having the first thickness and the silicon oxide film having the second thickness are the same compositions, and
   wherein the first and second thickness of the silicon oxide film are made to be substantially equal in the step of removing a portion of the stress layer over the other transistor of the PMOS transistor and the NMOS transistor and leaving a portion of the stress layer over the one transistor of the PMOS transistor and the NMOS transistor.

2. The semiconductor device manufacturing method according to claim 1, wherein the stress layer is a silicon nitride film.

3. The semiconductor device manufacturing method according to claim 1, further comprising forming a silicide blocking film on the PMOS transistor and the NMOS transistor prior to the removing a portion of the silicon oxide film over the PMOS transistor and the NMOS transistor.

4. The semiconductor device manufacturing method according to claim 3, wherein the stress layer and the silicide blocking film include silicon nitride.

5. The semiconductor device manufacturing method according to claim 1, wherein the removing a portion of the stress layer includes etching of the stress layer and etching a surface of the second thickness of the silicon oxide film.

6. The semiconductor manufacturing method according to claim 1, wherein both the silicon oxide film having the first thickness and the silicon oxide film having the second thickness are $SiO_2$.

7. The semiconductor manufacturing method according to claim 1, wherein both the first silicon oxide film and the second silicon oxide film are $SiO_2$.

8. A semiconductor device manufacturing method, comprising:
   forming a PMOS transistor and an NMOS transistor on a substrate;
   forming a first silicon oxide film covering the PMOS transistor and the NMOS transistor;
   removing a portion of the first silicon oxide film over one transistor of the PMOS transistor and the NMOS transistor, and leaving a portion of the first silicon oxide film over the other transistor of the PMOS transistor and the NMOS transistor;
   forming a second silicon oxide film of the same composition as the first silicon oxide film such that a silicon oxide film covering one transistor of the PMOS transistor and the NMOS transistor has a first thickness and a silicon oxide film covering the other transistor of the PMOS transistor and the NMOS transistor has a second thickness different from the first thickness;
   providing a stress layer over the second silicon oxide film to apply a stress to one transistor of the PMOS transistor and the NMOS transistor;
   removing a portion of the stress layer over the other transistor of the PMOS transistor and the NMOS transistor, and leaving a portion of the stress layer over the one transistor of the PMOS transistor and the NMOS transistor, such that the first thickness of the silicon oxide film covering one transistor of the PMOS transistor and the NMOS transistor and the second thickness of the silicon oxide film covering the other transistor of the PMOS transistor and the NMOS transistor are made to be substantially equal;
   performing thermal treatment of the substrate where the stress layer over the other transistor of the PMOS transistor and the NMOS transistor is removed;
   removing the portion of the stress layer over the one transistor of the PMOS transistor and the NMOS transistor; and
   removing the first and second silicon oxide films over both the PMOS transistor and the NMOS transistor on the substrate,
   wherein the first thickness of the silicon oxide film covering one transistor of the PMOS transistor and the NMOS transistor and the second thickness of the silicon oxide film covering the other transistor of the PMOS transistor and the NMOS transistor are made to be substantially equal in the step of removing a portion of the stress layer over the other transistor of the PMOS transistor and the NMOS transistor and leaving a portion of the stress layer over the one transistor of the PMOS transistor and the NMOS transistor.

9. The semiconductor device manufacturing method according to claim 8, wherein the step of the removing the portion of the stress layer over the other transistor of the PMOS transistor and the NMOS transistor is performed by dry etching and the thickness of the first and second silicon oxide films over the other transistor of the PMOS transistor and the NMOS transistor is to be substantially equal to the thickness of the second silicon oxide film over the one transistor of the PMOS transistor and the NMOS transistor.

10. The semiconductor device manufacturing method according to claim 8, wherein the removing the portion of the stress layer over the one transistor of the PMOS transistor and the NMOS transistor is performed by wet etching.

11. The semiconductor device manufacturing method according to claim 8, wherein the stress layer is a silicon nitride film.

12. The semiconductor device manufacturing method according to claim 8, further comprising forming a silicide blocking film on both the PMOS transistor and the NMOS transistor prior to the removing the first and second silicon oxide films.

13. The semiconductor device manufacturing method according to claim 12, wherein the stress layer and the silicide blocking film include silicon nitride.

14. The semiconductor device manufacturing method according to claim 8, wherein the removing a portion of the stress layer includes etching of the stress layer and etching a surface of the second thickness of the second silicon oxide film.

* * * * *